US007706887B2

(12) United States Patent
Tai et al.

(10) Patent No.: US 7,706,887 B2
(45) Date of Patent: Apr. 27, 2010

(54) METHOD FOR INTEGRATING PRE-FABRICATED CHIP STRUCTURES INTO FUNCTIONAL ELECTRONIC SYSTEMS

(75) Inventors: Yu-Chong Tai, Pasadena, CA (US); Damien C. Rodger, Los Angeles, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 11/933,222

(22) Filed: Oct. 31, 2007

(65) Prior Publication Data

US 2008/0154365 A1    Jun. 26, 2008

Related U.S. Application Data

(62) Division of application No. 10/974,006, filed on Oct. 25, 2004, now Pat. No. 7,338,836.

(60) Provisional application No. 60/517,432, filed on Nov. 5, 2003.

(51) Int. Cl.
*A61N 1/18* (2006.01)
(52) U.S. Cl. ............................. 607/54; 607/2; 257/678; 623/6.63
(58) Field of Classification Search .................... 607/53, 607/54, 2; 623/6.63; 257/678
See application file for complete search history.

(56) References Cited

U.S. PATENT DOCUMENTS

| 6,368,349 | B1 * | 4/2002 | Wyatt et al. ................. 623/6.63 |
| 6,389,317 | B1 * | 5/2002 | Chow et al. ................... 607/54 |
| 6,479,890 | B1 * | 11/2002 | Trieu et al. ................... 257/678 |

* cited by examiner

*Primary Examiner*—Carl H Layno
*Assistant Examiner*—Pamela M Bays
(74) *Attorney, Agent, or Firm*—J. Steven Rutt; Foley & Lardner LLP.

(57) ABSTRACT

A method (and resulting structure) for fabricating a sensing device. The method includes providing a substrate comprising a surface region and forming an insulating material overlying the surface region. The method also includes forming a film of carbon based material overlying the insulating material and treating to the film of carbon based material to pyrolyzed the carbon based material to cause formation of a film of substantially carbon based material having a resistivity ranging within a predetermined range. The method also provides at least a portion of the pyrolyzed carbon based material in a sensor application and uses the portion of the pyrolyzed carbon based material in the sensing application. In a specific embodiment, the sensing application is selected from chemical, humidity, piezoelectric, radiation, mechanical strain or temperature.

25 Claims, 17 Drawing Sheets

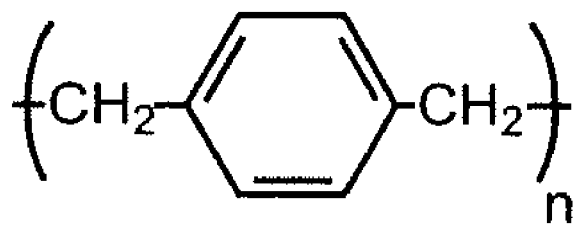
Parylene N
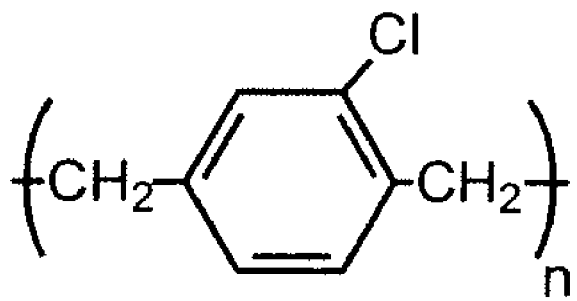
Parylene C
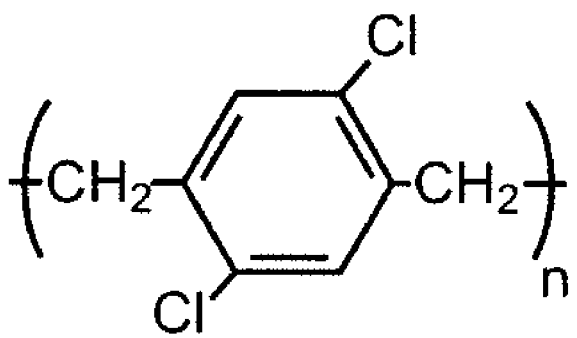
Parylene D
FIG. 7

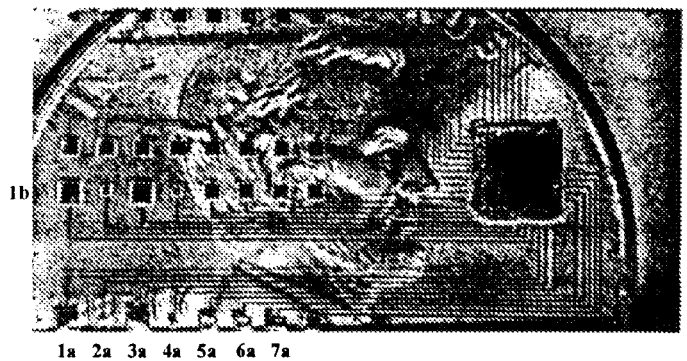
Figure 11: Overhead view of parylene "skin" with embedded chip (numbers correspond to Table 1)
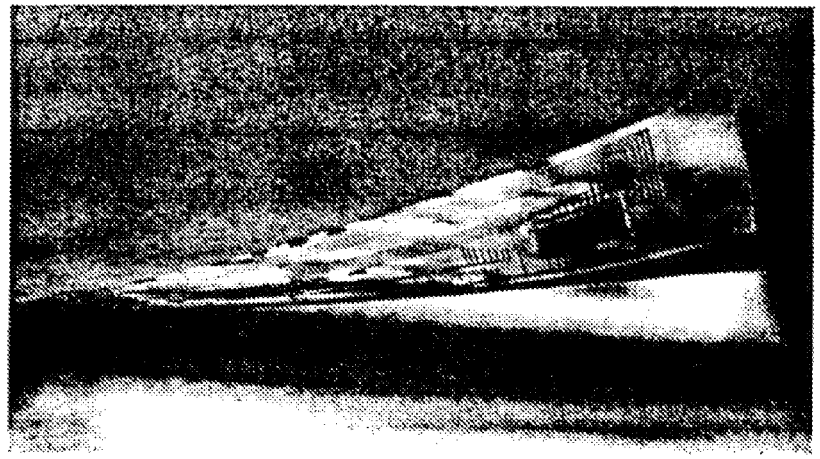
Figure 12: Backside view of parylene "skin" with embedded chip

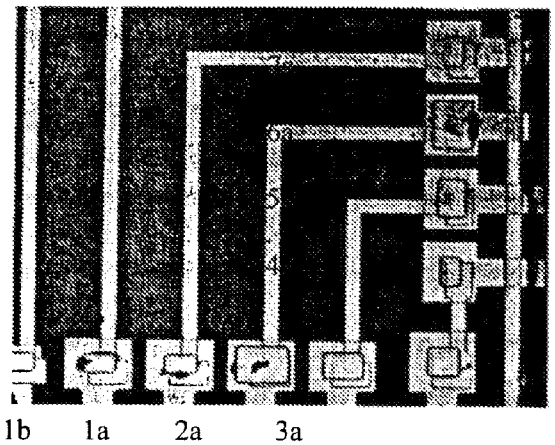
Figure 13: Magnified view of perimeter to chip interconnects (numbers correspond to Table 1)
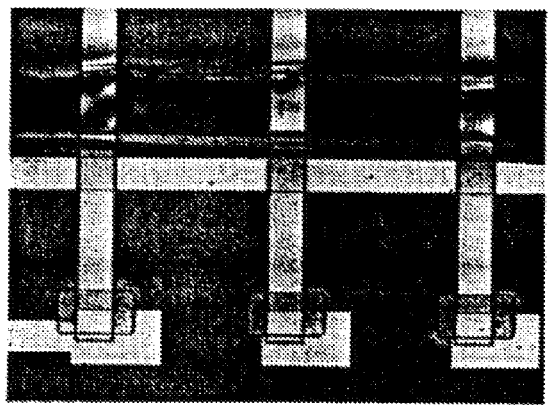
Figure 14: Metallization continuity over perimeter to chip junction

| Pad | 1b | 1a | 2a | 3a | 4a | 5a | 6a | 7a |
|-----|------|------|------|------|------|------|------|------|
| 1b  | X    | 323000 | 327000 | 330000 | 327000 | 325000 | 322000 | 61.0 |
| 1a  | 323000 | X | 577000 | 448000 | 441000 | 580000 | 60.9 | 325000 |
| 2a  | 327000 | 577000 | X | 599000 | 582000 | 59.9 | 454000 | 319000 |
| 3a  | 330000 | 448000 | 599000 | X | 57.1 | 587000 | 499000 | 319000 |
| 4a  | 327000 | 441000 | 582000 | 57.1 | X | 569000 | 490000 | 320000 |
| 5a  | 325000 | 580000 | 59.9 | 587000 | 569000 | X | 478000 | 321000 |
| 6a  | 322000 | 60.9 | 454000 | 499000 | 490000 | 478000 | X | 316000 |
| 7a  | 61.0 | 325000 | 319000 | 319000 | 320000 | 321000 | 316000 | X |

Table 1: Resistance in Ω between perimeter pads which are electrically connected to the embedded hip. Arrow above and to the left indicate shorted pairs

FIG. 15

METHOD FOR INTEGRATING PRE-FABRICATED CHIP STRUCTURES INTO FUNCTIONAL ELECTRONIC SYSTEMS

CROSS-REFERENCES TO RELATED APPLICATIONS

This is a divisional application of U.S. Ser. No. 10/974,006 filed Oct. 25, 2004, issued as U.S. Pat. No. 7,338,836 on Mar. 4, 2008, which claims priority to U.S. Provisional Application No. 60/517,432 filed Nov. 5, 2003, and all prior related applications cited herein are incorporated by reference in their entireties.

BACKGROUND OF THE INVENTION

The present invention is directed to manufacturing objects. More particularly, the invention provides a method and resulting structure for integrating a chip structure onto a film of flexible material. Merely by way of example, the invention has been applied to integrated circuit chips provided on polymer based structures such as a film of parylene material. But it would be recognized that the invention has a much broader range of applicability. For example, the invention can be applied to other chip structures including discrete electronic components, micro-electrical mechanical systems (MEMS), nano-electrical mechanical systems (NEMS), displays, power supplies, biological chips, medical chips, and biomedical chips. Additionally, the integrated chip and film structures can be applied to the fields of electronics, life sciences, publishing, medicine, business, finance, and/or other areas of commerce and/or lifestyle.

Over the years, microelectronics have proliferated into many aspects of modern day life. In the early days, Robert N. Noyce invented the integrated circuit, which is described in "Semiconductor Device-and-Lead Structure" under U.S. Pat. No. 2,981,877. Integrated circuits evolved from a handful of electronic elements into millions and even billions of components fabricated on a small slice of silicon material. Such integrated circuits have been incorporated into and control many conventional devices, such as automobiles, computers, medical equipment, and even children's toys.

Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits. Increasing circuit density has not only improved the complexity and performance of integrated circuits but has also provided lower cost parts to the consumer.

An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is packaging of such integrated circuit chip using molding and/or encapsulation techniques. More particularly, conventional integrated circuits are often diced into individual integrated circuit chips. Such chips are individually packaged mounted on lead frames using die attach and/or bonding techniques. The chip and lead frames are then encapsulated using injection molding processes. Such molding processes use epoxy based plastic materials that are often very durable, but hard and rigid. Lead frames must also often be bonded using wire bonding techniques to connect the individual integrated circuits to leads and/or connectors. Plastic encapsulating packages are often cumbersome, difficult to integrate with other devices, and are limited due to size and shape. Other limitations include lack of biocompatibility, hermeticity, and general degradation in salt/water environments, among others. These and other limitations will be described in further detail throughout the present specification and more particularly below.

From the above, it is seen that an improved technique for processing materials is desired.

BRIEF SUMMARY OF THE INVENTION

According to the present invention, techniques directed to manufacturing objects are provided. More particularly, the invention provides a method and resulting structure for integrating a chip structure onto a film of flexible material. Merely by way of example, the invention has been applied to integrated circuit chips provided on polymer based structures such as a film of parylene material. But it would be recognized that the invention has a much broader range of applicability. For example, the invention can be applied to other chip structures including discrete electronic components, micro-electrical mechanical systems (MEMS), nano-electrical mechanical systems (NEMS), displays, power supplies, biological chips, medical chips, and biomedical chips. Additionally, the integrated chip and film structures can be applied to the fields of electronics, life sciences, publishing, medicine, business, clothing, finance, and other areas of commerce and/or lifestyle.

In a specific embodiment, the present invention provides a method for manufacturing integrated objects, e.g., electronic devices, biomedical devices, and sensors. The method includes providing a holder substrate, which has at least one recessed region, the recessed region having a predetermined shape. The holder substrate has a selected thickness and is characterized as being substantially rigid in shape. The method includes aligning a chip comprising a face and a backside into the predetermined shape of the recessed region and disposing the chip into the recessed region. The chip is secured into the recessed region. The method includes providing a first film of insulating material having a first thickness overlying the face and portions of the holder substrate to attach the chip to a portion of the first film of insulating material and patterning the first film of insulating material to form at least one opening through a portion of the first thickness to a contact region on the face of the chip. The method includes forming a metallization layer overlying the first film of insulating material to couple to the contact region through the one opening and forming a protective layer overlying the metallization layer. The method includes releasing the chip from the holder substrate while maintaining attachment of the chip to the first film of insulating material.

In a specific embodiment, the present invention provides an alternative method for manufacturing integrated objects, e.g., electronic devices, biomedical devices, and sensors. The method includes providing a holder substrate, which has at least one recessed region, the recessed region having a predetermined shape. The holder substrate has a selected thickness and is characterized as being substantially rigid in shape. The method includes aligning a chip comprising a face and a backside into the predetermined shape of the recessed region and disposing the chip into the recessed region. The chip is secured into the recessed region. The method includes providing a first film of insulating material having a first thickness overlying the face and portions of the holder substrate to attach the chip to a portion of the first film of insulating material and patterning the first film of insulating material to form at least one opening through a portion of the first thickness to a contact region on the face of the chip. The method includes forming a metallization layer overlying the first film of insulating material to couple to the contact region through the one opening and forming a protective layer overlying the metallization layer. Optionally, the method includes releasing the chip from the holder substrate while maintaining attachment of the chip to the first film of insulating material.

In an alternative specific embodiment, the present invention provides a method for manufacturing integrated electronic devices onto flexible substrate structures. The method includes providing a holder substrate, which has at least one recessed region surrounded by a peripheral region. The recessed region has a predetermined shape and the peripheral region has a surface portion. The holder substrate has a selected thickness and is characterized as being substantially rigid in shape. The method aligns an integrated circuit chip comprising a face and a backside into the predetermined shape of the recessed region surrounded by the peripheral region and disposes the integrated circuit chip into the recessed region. The method secures the integrated circuit chip into the recessed region using a release layer, which is formed overlying portions of the peripheral region. The method provides a first flexible film of insulating material having a first thickness overlying the face and portions of the release layer formed on the peripheral region of the holder substrate to attach the integrated circuit chip to a portion of the first film of insulating material. The method patterns the first flexible film of insulating material to form at least one opening through a portion of the first thickness to a contact region on the face of the integrated circuit chip and forms a metallization layer overlying the first flexible film of insulating material to couple to the contact region through the at least one opening in the first flexible film of insulating material. The method forms a flexible protective layer overlying the metallization layer and then patterns a portion of the flexible protective layer. The method then releases the integrated circuit chip from the holder substrate via the release layer while maintaining attachment of the integrated circuit chip to first flexible film of insulating material. Any remaining portions, if any, of the release layer are removed from the integrated circuit chip to form a flexible sandwich structure. The flexible sandwich structure includes a portion of the first flexible film, a portion of the metallization layer, and a portion of the flexible protective layer.

In yet an alternative specific embodiment, the present invention provides an integrated chip and a flexible substrate device. The device has a chip (e.g., solid substrate structure) comprising a face and a backside. The device has a first flexible film of insulating material having a first thickness overlying the face of the chip. At least one opening is formed through a portion of the first thickness to a contact region on the face of the chip. A metallization layer is overlying the first flexible film of insulating material to couple to the contact region through the at least one opening in the first flexible film of insulating material. The device has a flexible protective layer overlying the metallization layer. A flexible sandwich structure is formed by a portion of the first flexible film of insulating material, a portion of the metallization layer, and a portion of the flexible protective layer. A surface area region is characterized by the flexible sandwich structure. In a specific embodiment, the surface area region has a size of at least 1.1 times greater than a face surface region of the face of the chip or even larger depending upon the specific embodiment.

Many benefits are achieved by way of the present invention over conventional techniques. For example, the present technique provides an easy to use process that relies upon conventional technology. In some embodiments, the method provides higher device yields. Additionally, the method provides a process that is compatible with conventional process technology without substantial modifications to conventional equipment and processes. Preferably, the invention provides for a method and device that can provide a flexible film of material having electronic chips thereon. Additionally, the present invention provides a film of flexible material that is generally easy to use, inert, light weight, and has other desirable characteristics. Using Parylene rather than conventional substrate materials allows for improvements in performance due to its mechanical and thermal properties.

Additional features and/or benefits may include, but are not limited to:
1. Direct interconnection more robust than wire-bonding or bump-bonding;
2. Much greater functionality possible because chips of any complexity can be integrated into devices;
3. Separately fabricated chips can be interconnected, enabling large concatenated circuits;
4. Devices resulting from this process are flexible, e.g., flexibility equivalent to plastic wrap for food products;
5. Overall device is well sealed from external environment/biocompatible;
6. High-density of electrical connections (e.g., 10,000 per $mm^2$ or larger) is possible.

Depending upon the embodiment, one or more of these benefits may be achieved. These and other benefits will be described in more detail throughout the present specification and more particularly below.

In a specific embodiment, an impediment to the fabrication of complex electronics (including but not limited to electrical and mechanical sensors) is the difficulty inherent in fabrication from scratch of an entire device that include chips such as integrated circuits (ICs). This is because IC fabrication often requires very high precision, and usually uses processes that are not easily compatible with sensor fabrication modalities. As such, these ICs are usually fabricated on a wafer at foundries throughout the country, are diced into chips, and are wire-bonded or sometimes bump-bonded to separately fabricated devices. If, however, computing circuits and driving electronics are fabricated at a foundry and can be easily integrated into the fabrication process of a flexible sensor or electrode stimulator, rather than using wire-bonding for attachment, these devices would be more robust according to a preferred embodiment. What is more, if separately fabricated chips could be connected to one another using a flexible substrate, or skin, we can effectively make concatenated circuits that are more complex and also flexible. These and other features of the present invention can be found throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIGS. 7-15 are simplified diagrams of experimental results according to embodiments of the present invention.

DETAILED DESCRIPTION OF THE INVENTION

According to the present invention, techniques directed to manufacturing objects are provided. More particularly, the invention provides a method and resulting structure for integrating a chip structure onto a film of flexible material. Merely by way of example, the invention has been applied to integrated circuit chips provided on polymer based structures such as a film of parylene material. But it would be recognized that the invention has a much broader range of applicability. For example, the invention can be applied to other chip structures including discrete electronic components, micro-electrical mechanical systems (MEMS), nano-electrical mechanical systems (NEMS), displays, power supplies, biological chips, medical chips, and biomedical chips. Additionally, the integrated chip and film structures can be applied to the fields of electronics, life sciences, publishing, medicine, business, finance clothing, other areas of commerce and/or lifestyle, and the like.

Figure 1:
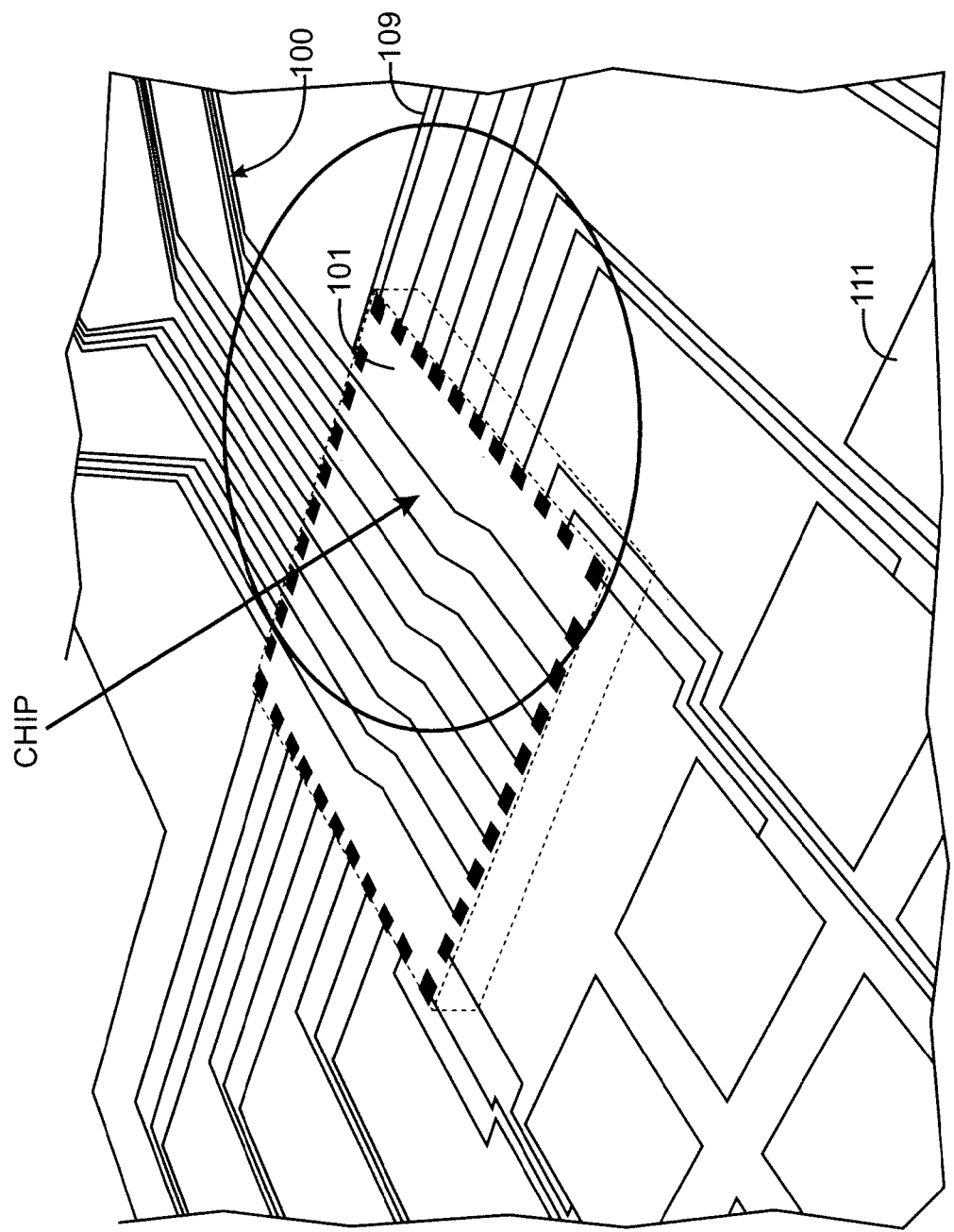
FIG. 1 is a simplified diagram of an integrated chip and flexible substrate according to an embodiment of the present invention.

FIG. 1 is a simplified diagram of an integrated chip and flexible substrate 100 according to an embodiment of the present invention. This diagram is merely an example, which should not unduly limit the scope of the claims herein. One of ordinary skill in the art would recognize many variations, modifications, and alternatives. As shown, the present invention provides an integrated chip and a flexible substrate device 100. The device has a chip (e.g., solid substrate structure) 101 comprising a face and a backside. The device also has a thickness. The chip can be any substrate structure such as an integrated circuit chip, a MEMS and/or NEMS device, a discrete device or devices, a power supply, a biological chip, a medical chip, a display chip, a battery, a light, any combination of these, and others. Of course, one of ordinary skill in the art would recognize many variations, modifications, and alternatives.

Figure 1A:
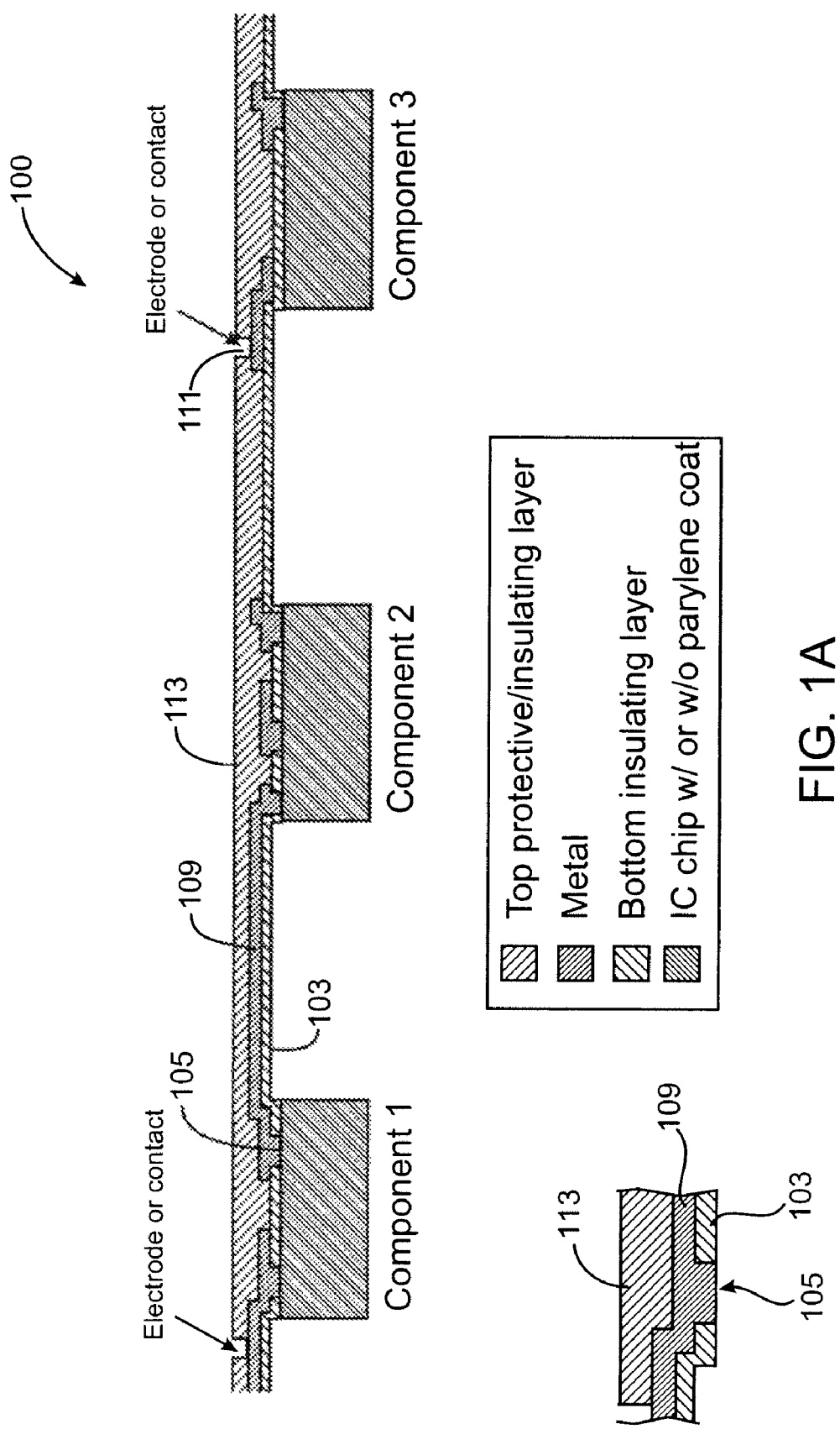
FIG. 1A is a simplified cross-sectional view diagram of the integrated chip and flexible substrate according to an embodiment of the present invention.

Referring now to FIG. 1A, the device has a first flexible film of insulating material 103 having a first thickness overlying the face of the chip according to a specific embodiment. The first flexible material is on and in contact with the face of the chip. Alternatively, there may also be other layers in between the flexible material and the chip. Preferably, the first flexible film of insulating material comprises a Parylene Material and/or other like material. In a specific embodiment, the parylene material has a thickness ranging from about 0.1 microns to about 100 microns and less than 1 mm. At least one opening 105 is formed through a portion of the first thickness to a contact region on the face of the chip. The contact region is often a bonding pad or other contact structure. Preferably, the bonding pad has a surface dimension of 100 microns or less or 80 microns or less or 50 microns or less depending upon the embodiment.

In a specific embodiment, a metallization layer 109 is overlying the first flexible film of insulating material to couple to the contact region through at least one opening in the first flexible film of insulating material. In a specific embodiment, the metallization layer is selected from aluminum, gold, copper, silver, platinum, titanium, iridium, titanium, tungsten, doped silicon, conductive polymers, any combination of these, including alloys, multi-layered structures, and the like. As shown, the metallization layer has been patterned to form conductive traces from the chip to various other elements. The contact region can be a via structure that connects the metallization layer to the chip and other outside circuit elements, depending upon the specific embodiment. As shown, the elements may include electrodes 111 or other like structures. Additionally, the elements can also include discrete electronic components, micro-electrical mechanical systems (MEMS), nano-electrical mechanical systems (NEMS), displays, power supplies, biological chips, medical chips, and biomedical chips depending upon the specific embodiment.

The device also has a flexible protective layer 113 overlying the metallization layer according to a specific embodiment. Preferably, the flexible protective layer comprises a Parylene material and/or other like structure. A flexible sandwich structure is formed by a portion of the first flexible film of insulating material, a portion of the metallization layer, and a portion of the flexible protective layer. A surface area region is characterized by the flexible sandwich structure, the surface area region having a size of at least 1.1 times greater than a face surface region of the face of the chip according to a specific embodiment.

Figure 1B:
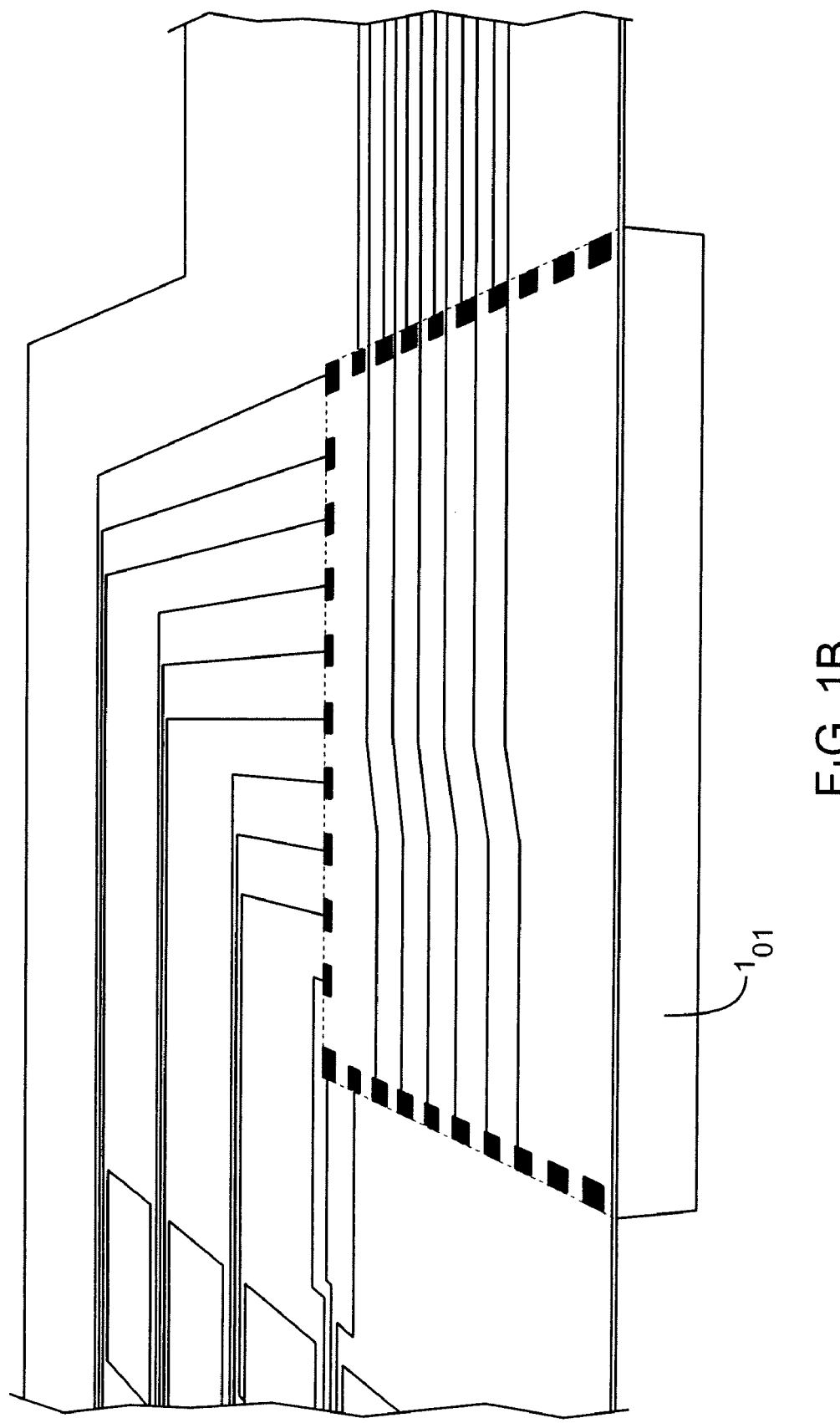
FIGS. 1B-1D are simplified diagrams of alternative views of the integrated chip and substrate according to embodiments of the present invention.
Figure 1C:
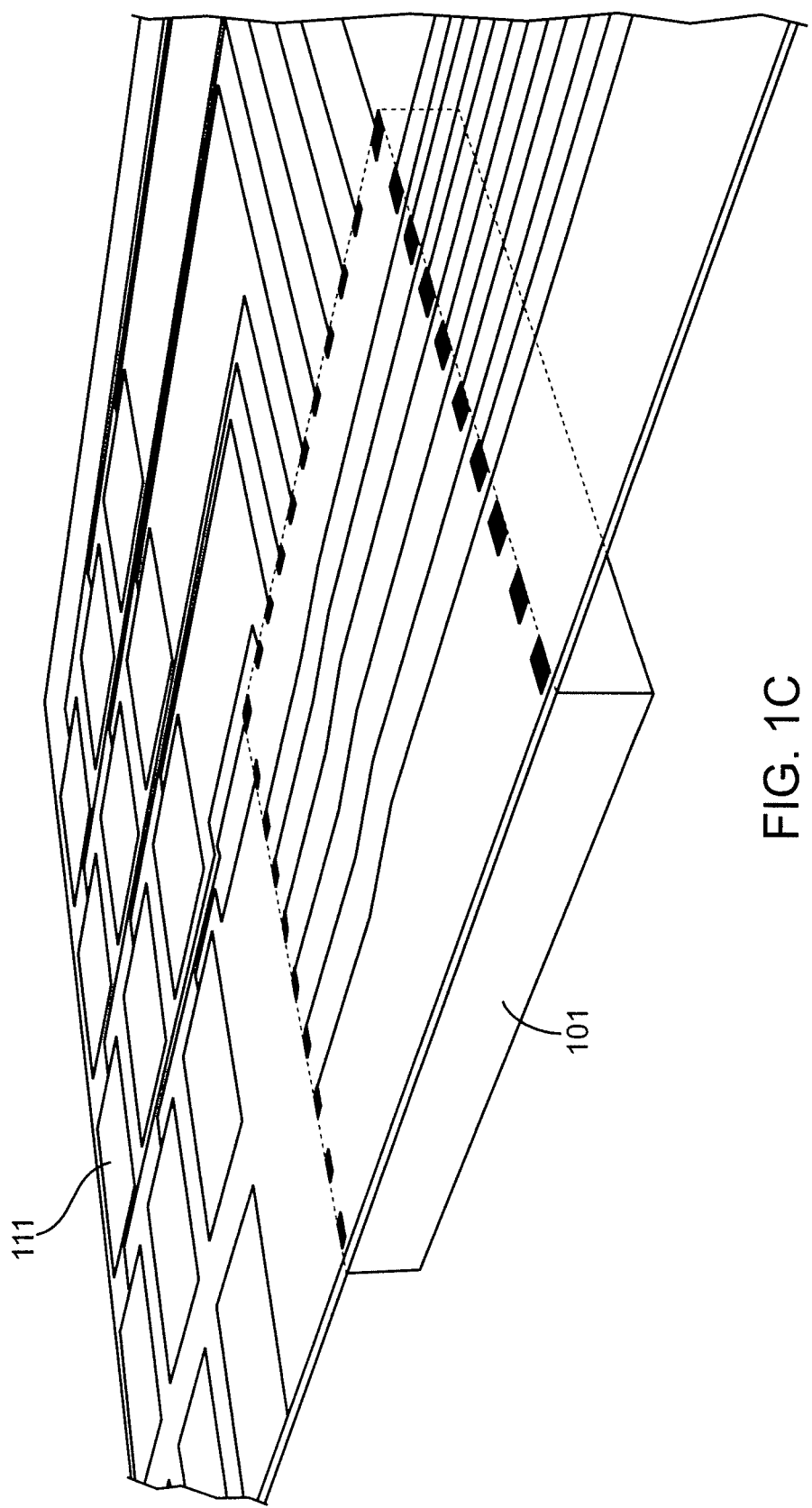
Figure 1D:
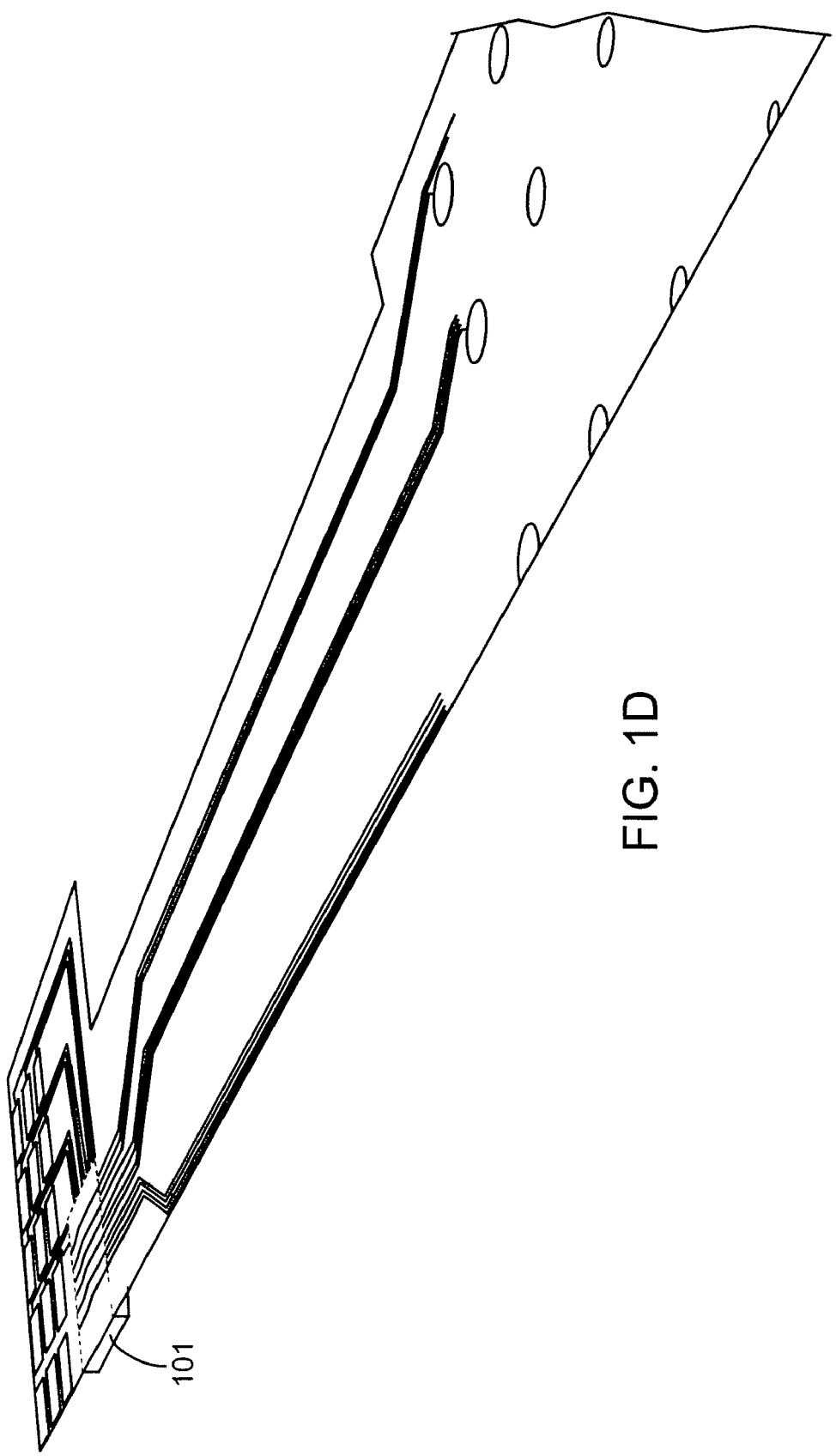

Preferably, the packaged chip and flexible film have certain desirable characteristics. That is, the packaged chip and film are flexible and can be bent while the chip is maintained in the film. The packaged chip is generally inert and can be biocompatible according to a specific embodiment. The integrated chip also has an overall thickness ranging from about 1 micron to about 1 millimeter and could be less than 1 centimeter depending upon the specific embodiment. Additionally, the integrated chip has a rigid or flexible region capable of having a line density of 50-1000 lines per millimeter and greater depending upon the embodiment. Refer also to FIGS. 1B-1D. Of course, one of ordinary skill in the art would recognize many other variations, modifications, and alternatives. Further details of certain methods for fabricating the present integrated substrate structure can be found throughout the present specification and more particularly below.

A method according to an embodiment of the present invention for fabricating an integrated substrate structure is briefly outlined below.

1. Start process;
2. Provide silicon wafer;
3. Form trenches in silicon wafer to form patterned substrate;
4. Form release layer within trenches;
5. Align chip to trench;

6. Dispose chip into trench;
7. Deposit parylene overlying chip and patterned substrate;
8. Form metallization overlying parylene;
9. Pattern metallization;
10. Treat parylene surface;
11. Form protective layer overlying patterned metal and exposed portions of parylene;
12. Release sandwich structure including parylene, metallization, protective layer, and chip from patterned substrate via release layer; and
13. Perform other steps, as desired.

The above sequence of steps provides a method according to an embodiment of the present invention. As shown, the method uses a combination of steps including a way of forming an integrated chip and flexible film structure using a parylene bearing material or the like. As noted, trenches are etched in a pure single-crystal silicon wafer using DRIE (deep-reactive ion etching) or wet-etching that match (within certain tolerances) the dimensions of foundry or otherwise fabricated chips. Photoresist is spun on the wafer and in the trenches, and the chips (most likely with a pre-coating of parylene) are placed in the locations etched in the wafer. The entire device is placed in a parylene (Poly-para-xylylene) deposition system. Depending upon the specific embodiment, Parylene C, parylene N, or parylene D are deposited on the wafer by vapor deposition. Because the deposition of parylene is conformal to any exposed surfaces, the chips are effectively sealed in their locations on the wafer and the surface of the wafer has now been effectively planarized to facilitate easy fabrication of the rest of the device.

During the fabrication of the rest of the device, the parylene surface is at some time etched in the locations where electrical contact to the underlying IC chips is desired using standard photoresist patterning and $O_2$ plasma etching. Metal is deposited on the wafer and patterned using liftoff or chemical etching. A second layer of parylene is deposited on the first layer after a short surface treatment. The metal has thus been sealed between either two layers of parylene or between the chip and the overlying parylene layer. Further fabrication is possible, including but not limited to creation of contact areas in the overlying parylene. A solvent (e.g., acetone or resist stripper) is then used to remove the photoresist layer underlying the parylene and surrounding the chip. Other alternatives can also be provided where steps are added, one or more steps are removed, or one or more steps are provided in a different sequence without departing from the scope of the claims herein. Further details of the present method and structure can be found throughout the present specification and more particularly below.

Figure 2:
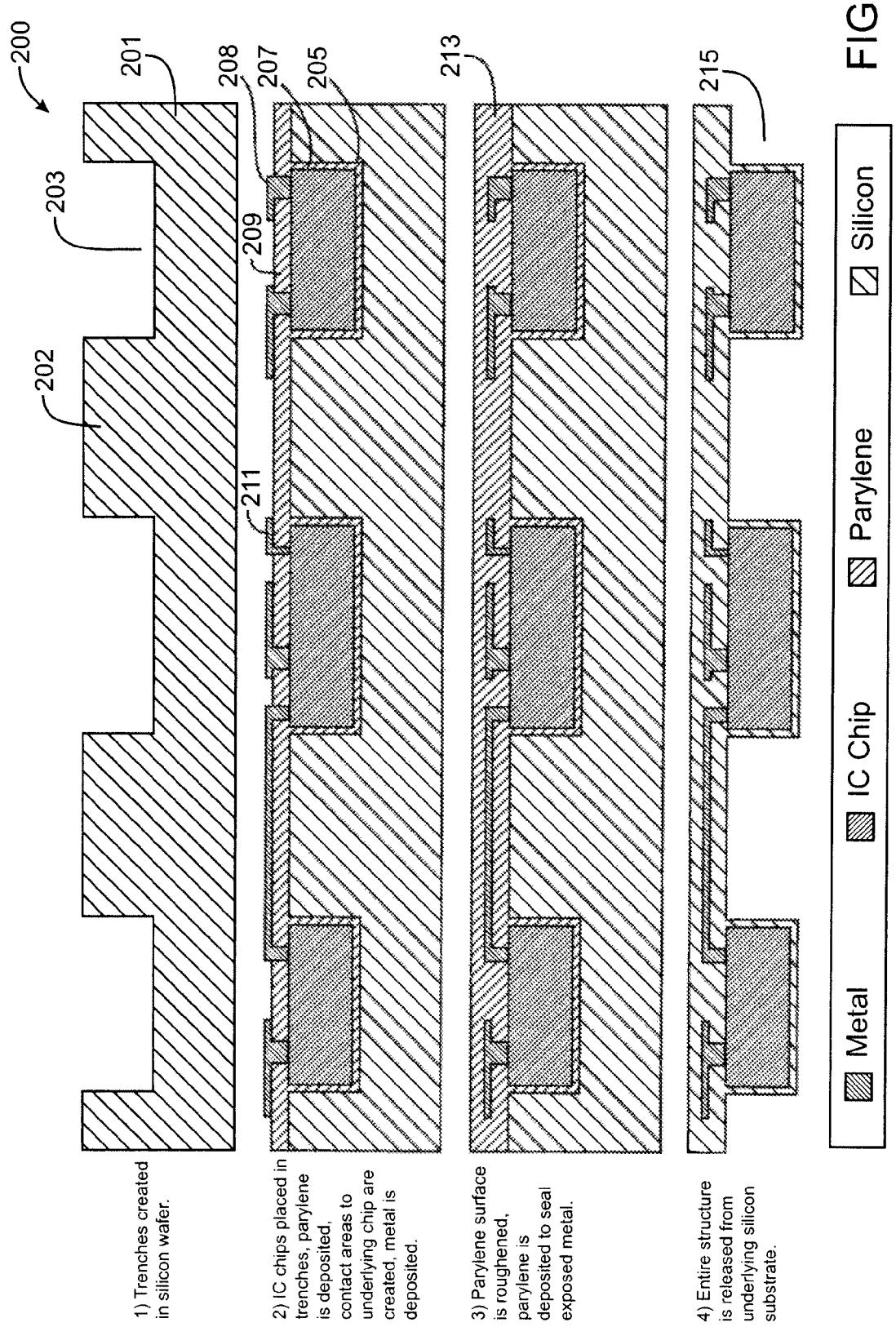
FIG. 2 is a simplified diagram illustrating a method of fabricating an integrated chip and flexible substrate according to an embodiment of the present invention.

FIG. 2 is a simplified diagram illustrating a method of fabricating an integrated chip and flexible substrate according to an embodiment of the present invention. This diagram is merely an example, which should not unduly limit the scope of the claims herein. One of ordinary skill in the art would recognize many variations, modifications, and alternatives. As shown, the present invention provides a method 200 for manufacturing integrated objects, e.g., chip and flexible substrate. The method includes providing a holder substrate 201. In a specific embodiment, the holder substrate is made of a material selected from an insulating material, a conductive material, or a semiconductor material. The insulating material can be selected from glass, quartz, plastic, or polymers or any combination of these materials. The conductive material can be selected from a metal, conducting polymers, doped semiconductor materials, any combination of these conductive materials. The semiconductor material can be selected from silicon, glass, Group III/V compound semiconductors, Group II/VI compound semiconductors, and any combination of these semiconductor materials. The holder substrate can be homogeneous, multilayered, or graded depending upon the specific embodiment.

Preferably, the holder substrate 201 has at least one recessed region 203, which has a predetermined shape. The holder substrate can also include a plurality of recessed regions. Each of such recessed regions has a depth, length, and width according to a specific embodiment. The recessed regions may be formed using etching, deep reactive ion etching, or other techniques combined with photo masking depending upon the specific embodiment. The holder substrate has a selected thickness and is characterized as being substantially rigid in shape. The holder substrate also has an upper surface region 202, which is preferably flat, surrounding the periphery of each of the recessed regions. The method forms a release layer overlying exposed portions of the recessed regions. In a specific embodiment, photo-resist is spun on the wafer and in the trenches, and the chips (most likely with a pre-coating of parylene are placed (which will be described in more detail below) in the locations etched in the wafer. Of course, there can be other variations, modifications, and alternatives, depending upon the specific embodiment.

Referring to the next step, the method aligns a chip comprising a face and a backside into the predetermined shape of the recessed region. The method also disposes the chip into the recessed region. Depending upon the specific embodiment, the chip is held using a transfer material during at least the aligning and disposing. In a specific embodiment, the transfer material comprises a tape material, e.g., Nitto tape, which can be attached to the face of the chip and easily removed from the face of the chip once it has been disposed into the recessed region. Preferably, the tape is used with the recessed region is a through hole or other configuration, which would not support the chip in a selected location. Depending upon the embodiment, the transfer material can hold multiple chips to be aligned and disposed into each of the respective recessed regions. Next, the method secures the chip into the recessed region using a glue layer 205 or other suitable material, which holds the chip into the recessed region for further processing.

Next, the method includes providing a first film of insulating material 207 having a first thickness overlying the face and portions of the holder substrate to attach the chip to a portion of the first film of insulating material. Preferably, the insulating material is a parylene or other like polymer material. In a preferred embodiment, the entire substrate including chip and recessed regions is placed in a parylene (Poly-para-xylylene) deposition system. An example of such deposition system is the PDS 2010 manufactured by Specialty Coating Systems, but can be others. Depending upon the specific embodiment, Parylene C, parylene N, or parylene D are deposited on the wafer by vapor deposition. Because the deposition of parylene is conformal to any exposed surfaces, the chips are effectively sealed in their locations on the wafer and the surface of the wafer has now been effectively planarized to facilitate easy fabrication of the rest of the device.

The method patterns the first film of insulating material to form at least one opening 208 through a portion of the first thickness to a contact region on the face of the chip. In a preferred embodiment, the parylene surface is etched in specific locations where electrical contact to the underlying IC chips is desired using standard photoresist patterning and $O_2$ plasma etching as well as other suitable techniques. The opening can even be 10 microns and less depending upon the specific embodiment. Of course, there can be other variations, modifications, and alternatives.

The method forms a metallization layer 24 overlying the first film of insulating material to couple to the contact region through the one opening. Metal is deposited on the wafer and patterned using liftoff or chemical etching. In a specific embodiment, the metallization is selected from aluminum, gold, copper, silver, platinum, titanium, iridium, and any combination of these metals. Preferably, the metallization is gold, which is relatively inert, for certain biological chips. The metallization has a thickness of about 0.1 to 10 microns and can be patterned having a density of 50-1000 lines per mm depending upon the specific embodiment. Of course, there can be other variations, modifications, and alternatives.

Next, the method forms a protective layer 213 overlying the metallization layer in a specific embodiment. As shown, a second layer of parylene is deposited on the first layer after a short surface treatment. As also shown, the patterned metal has thus been sealed between either two layers of parylene or between the chip and the overlying parylene layer. Further fabrication is possible, including but not limited to, creation of contact areas in the overlying parylene according to a specific embodiment. Other protective layers such as oxide, nitride, metal, ceramics, and polymers and/or any combination of these can also be used depending upon the specific embodiment.

The method then releases 215 the chip from the holder substrate while maintaining attachment of the chip to the first film of insulating material. A solvent (e.g., acetone or resist stripper) is then used to remove the photoresist layer underlying the parylene and surrounding the chip according to a specific embodiment. Other release techniques such as heating, other chemical, mechanical, ultrasonic, or other techniques may also be used according to the specific embodiment.

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

Figure 3:
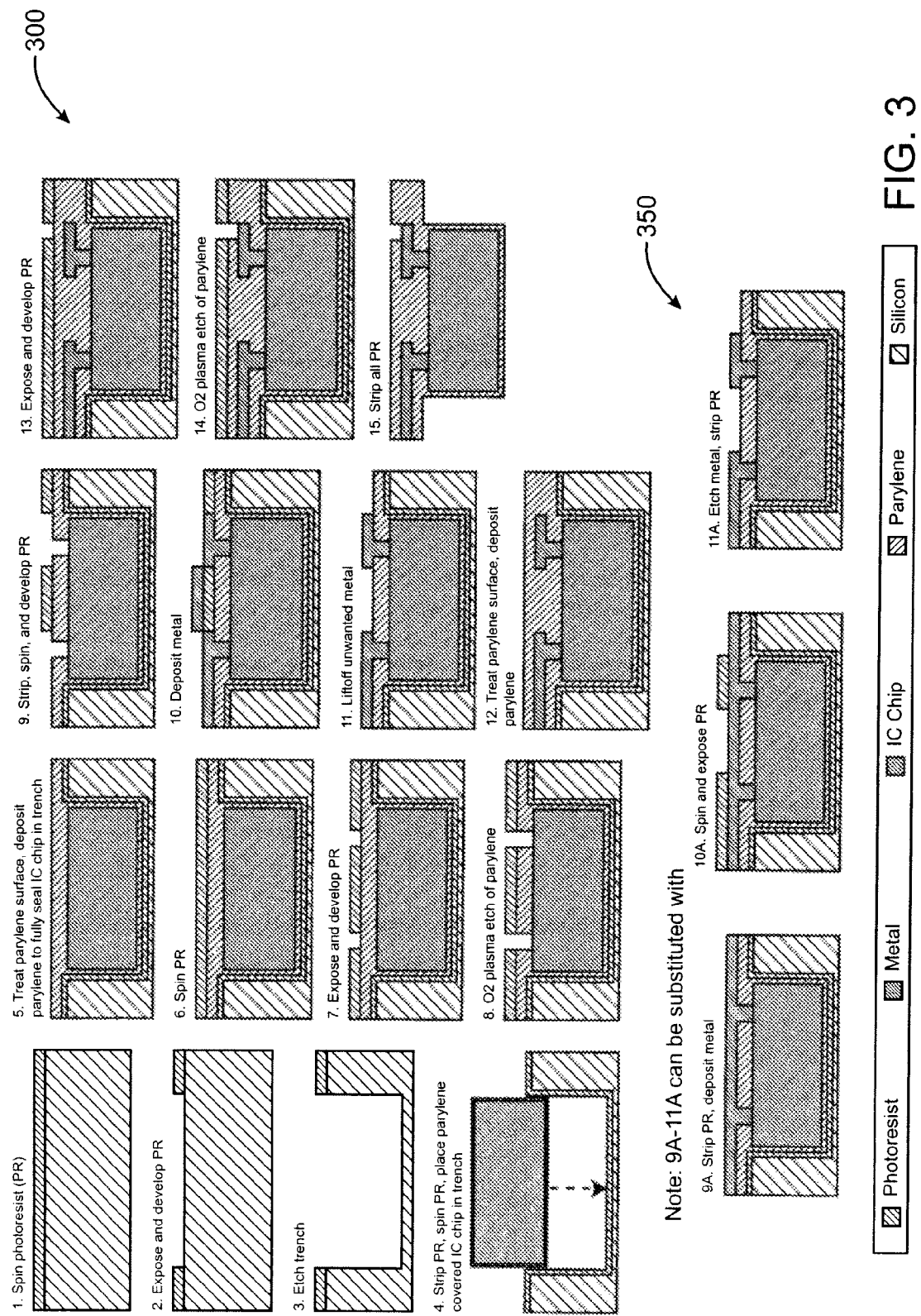

A method according to an alternative embodiment of the present invention for fabricating an integrated substrate structure is briefly outlined below. Such method has also been illustrated in the simplified diagrams 300 of FIG. 3. As shown, the method performs the following sequence of steps, which are numbered numerically from 1 through 15 in FIG. 3 (see reference numeral 300), which should not unduly limit the scope of the claims herein.

1. Spin photoresist on surfaces of the substrate;
2. Expose and develop the photoresist;
3. Etch trench;
4. Strip photoresist and dispose parylene covered chip into trench;
5. Treat parylene surface and deposit parylene to seal chip into trench;
6. Spin photoresist onto surfaces of parylene;
7. Expose and develop photoresist;
8. Pattern parylene with oxygen bearing plasma;
9. Strip photoresist, spin next photoresist; and pattern;
10. Deposit metallization overlying patterned parylene and photoresist;
11. Lift off undesired metallization;
12. Treat parylene surface, and deposit an additional parylene layer;
13. Spin photoresist and develop;
14. Pattern parylene layer;
15. Strip photoresist and release chip including parylene structures from substrate; and
16. Perform other steps, as desired;

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

A method according to yet an alternative embodiment of the present invention for fabricating an integrated substrate structure is briefly outlined below. Such method has also been illustrated in the simplified diagrams 300, 350 of FIG. 3. As shown, the method performs the following sequence of steps, which are numbered numerically from 1-8, 9A-11A, and 12-15 in FIG. 3 (see reference numerals 300, 350), which should not unduly limit the scope of the claims herein. As noted, steps 9-11 are substituted with the illustrations in steps 9A-11A also in FIG. 3.

1. Spin photoresist on surfaces of the substrate;
2. Expose and develop the photoresist;
3. Etch trench;
4. Strip photoresist and dispose parylene covered chip into trench;
5. Treat parylene surface and deposit parylene to seal chip into trench;
6. Spin photoresist onto surfaces of parylene;
7. Expose and develop photoresist;
8. Pattern parylene with oxygen bearing plasma;
9A. Strip photoresist and deposit metallization;
10A. Spin photoresist overlying metallization and expose photoresist;
11A. Etch metallization and strip photoresist;
12. Treat parylene surface, and deposit an additional parylene layer;
13. Spin photoresist and develop;
14. Pattern parylene layer;
15. Strip photoresist and release chip including parylene structures from substrate; and
16. Perform other steps, as desired.

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

Figure 4:
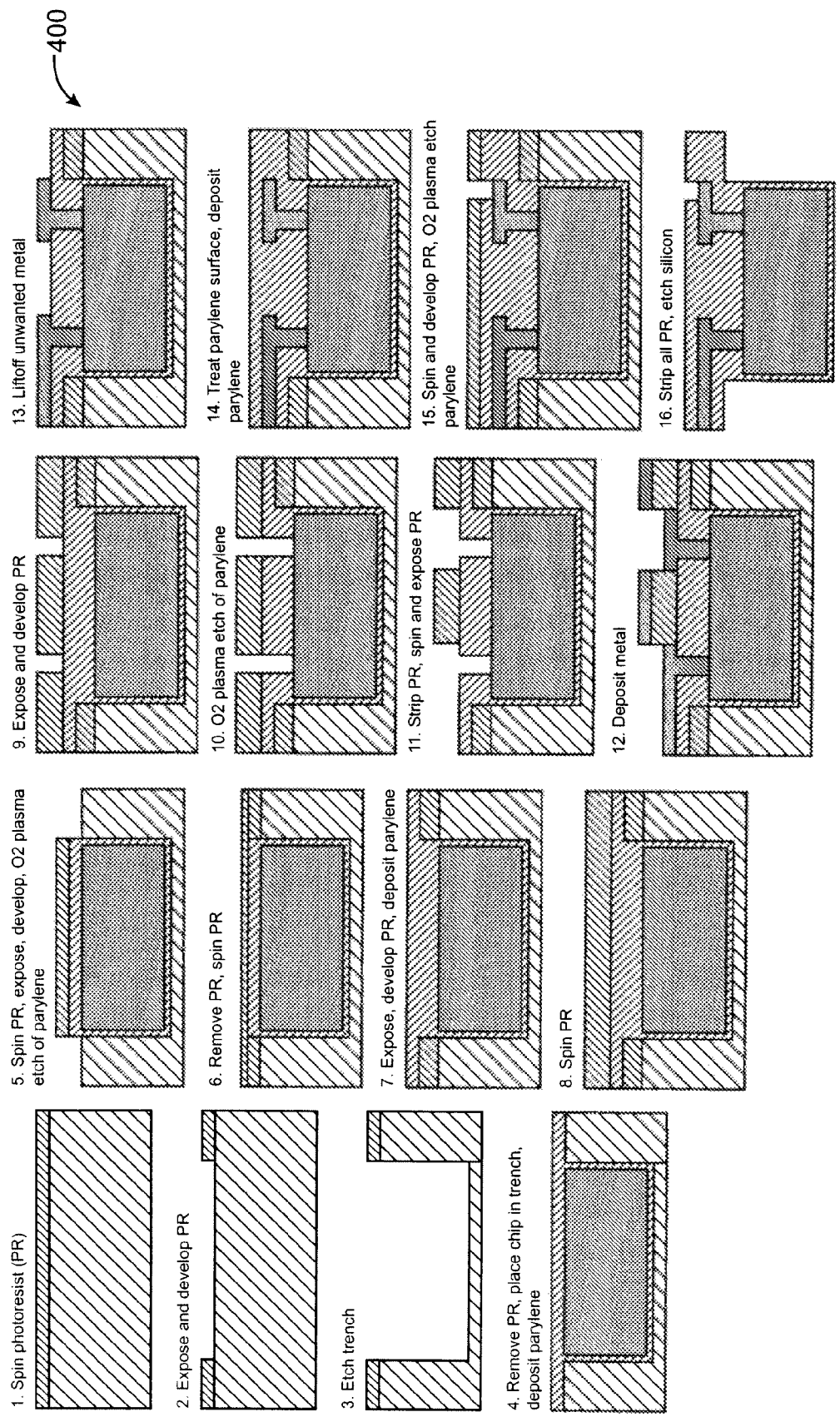
FIG. 4 is a simplified diagram illustrating an alternative method of fabricating an integrated chip and flexible substrate according to an embodiment of the present invention.

A method according to an alternative embodiment of the present invention for fabricating an integrated substrate structure is briefly outlined below. Such method has also been illustrated in the simplified diagrams 400 of FIG. 4. As shown, the method performs the following sequence of steps, which are numbered numerically from 1 through 16 in FIG. 4 (see reference numeral 400), which should not unduly limit the scope of the claims herein.

1. Spin photoresist on surfaces of the substrate;
2. Expose and develop the photoresist;
3. Etch trench;
4. Strip photoresist, dispose parylene covered chip into trench, and deposit parylene overlying chip surface and surface of substrate;

5. Spin photoresist onto surfaces of parylene, develop, and pattern parylene using oxygen plasma;
6. Remove photoresist and spin another layer of photoresist;
7. Expose photoresist, develop photoresist, and deposit parylene;
8. Spin photoresist;
9. Expose and develop photoresist;
10. Perform oxygen plasma etching on parylene;
11. Spin photoresist and expose photoresist;
12. Deposit metallization;
13. Lift off undesired metallization;
14. Treat parylene surface and deposit additional layer of parylene;
15. Spin and develop photoresist, pattern parylene using oxygen bearing plasma;
16. Strip photoresist and lift off chip with parylene films; and
17. Perform other steps, as desired.

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

Figure 5:
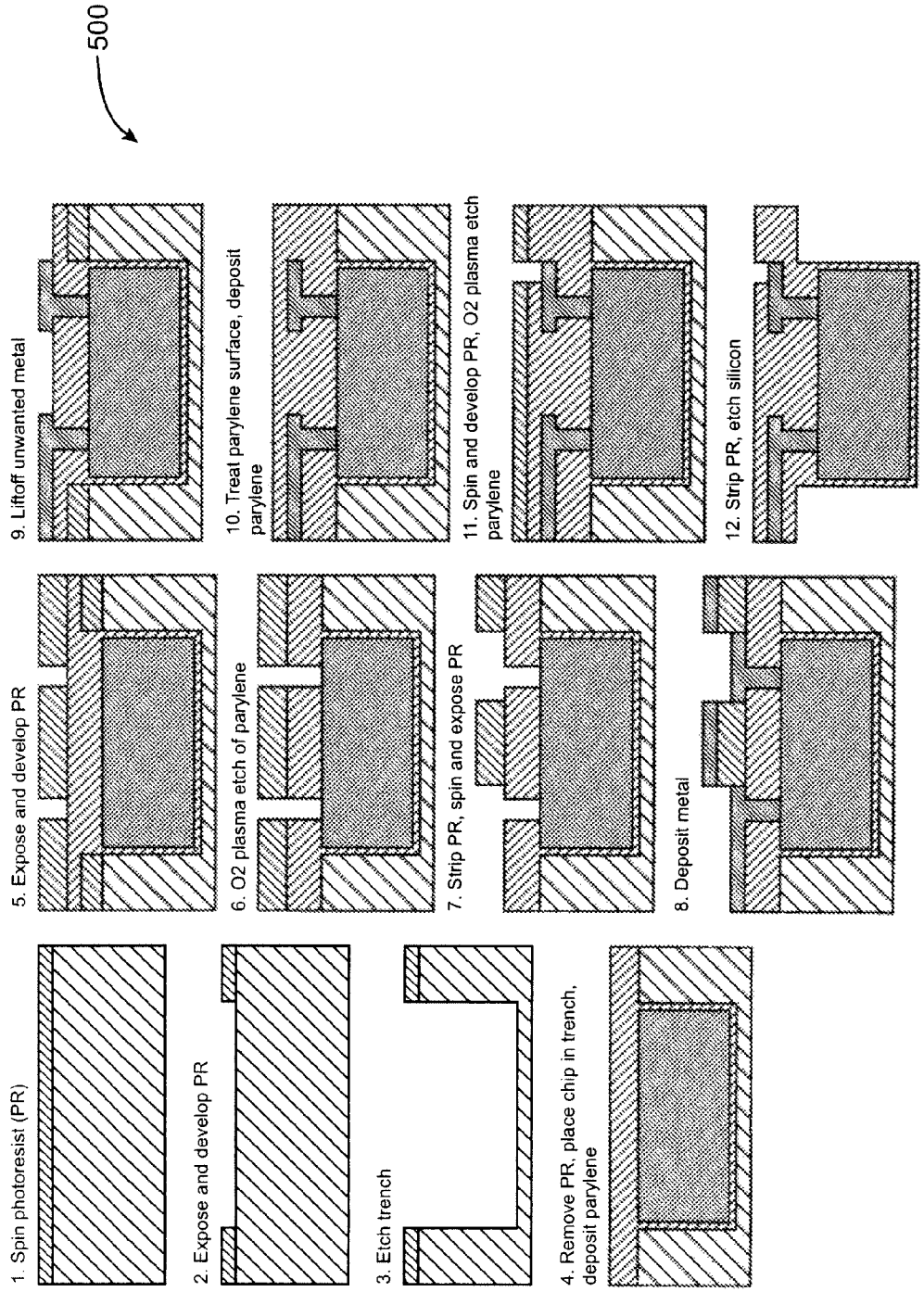
FIG. 5 is a simplified diagram illustrating yet an alternative method of fabricating an integrated chip and flexible substrate according to an embodiment of the present invention.

A method according to yet an alternative embodiment of the present invention for fabricating an integrated substrate structure is briefly outlined below. Such method has also been illustrated in the simplified diagrams 500 of FIG. 5. As shown, the method performs the following sequence of steps, which are numbered numerically from 1 through 15 in FIG. 5 (see reference numeral 500), which should not unduly limit the scope of the claims herein.
1. Spin photoresist on surfaces of the substrate;
2. Expose and develop the photoresist;
3. Etch trench;
4. Strip photoresist, dispose parylene covered chip into trench, and deposit parylene overlying chip surface and surface of substrate;
5. Spin photoresist onto surfaces of parylene and develop;
6. Pattern parylene using oxygen plasma;
7. Remove photoresist, spin another layer of photoresist, and expose;
8. Deposit metallization;
9. Lift off undesired metallization;
10. Treat parylene surface and deposit additional layer of parylene;
11. Spin and develop photoresist, pattern parylene using oxygen bearing plasma;
12. Strip photoresist and lift off chip with parylene films; and
13. Perform other steps, as desired.

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

Figure 6:
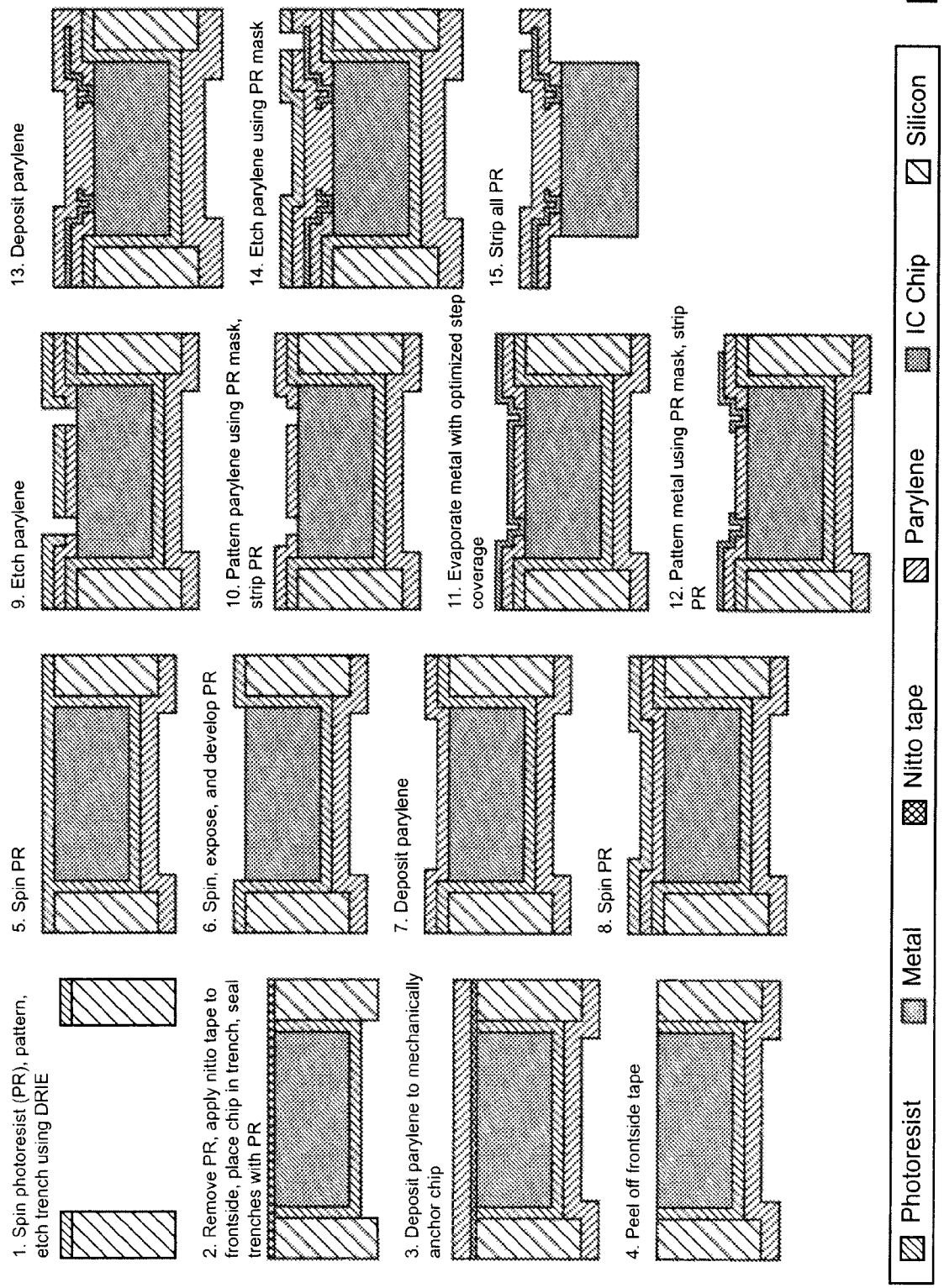
FIG. 6 is a simplified diagram illustrating still an alternative method of fabricating an integrated chip and flexible substrate according to an embodiment of the present invention.
Figure 8:
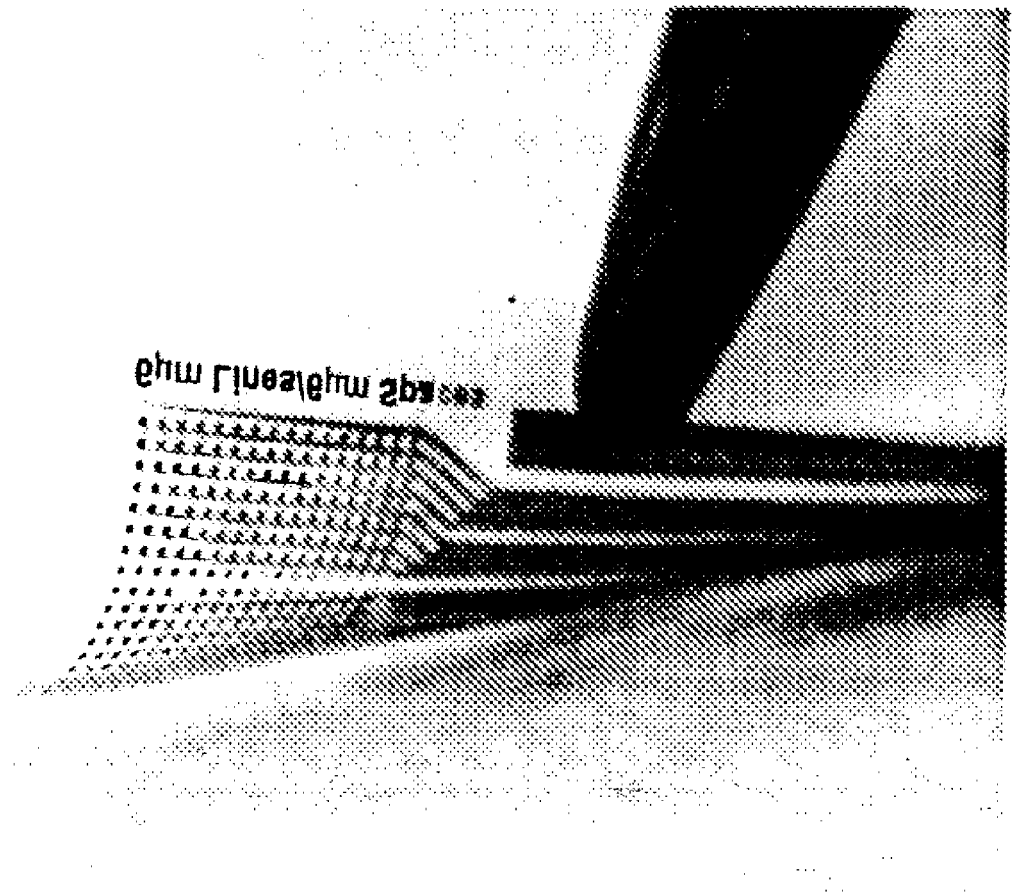

A method according to yet an alternative embodiment of the present invention for fabricating an integrated substrate structure is briefly outlined below. Such method has also been illustrated in the simplified diagrams 600 of FIG. 6. As shown, the method performs the following sequence of steps, which are numbered numerically from 1 through 15 in FIG. 6 (see reference numeral 600), which should not unduly limit the scope of the claims herein.
1. Spin photoresist on surfaces of the substrate, pattern, and etch trench using deep reactive ion etching;
2. Remove photoresist, apply tape to frontside of wafer, place chip into trench, and seal chip in trench with photoresist;
3. Deposit parylene to mechanically secure (e.g., anchor) chip into trench;
4. Peal off tape once chip has been secured into the trench;
5. Spin photoresist onto surfaces of parylene;
6. Expose and develop photoresist;
7. Deposit parylene;
8. Spin photoresist on parylene;
9. Pattern parylene;
10. Strip photoresist;
11. Deposit metallization with desired step coverage;
12. Pattern metallization using mask and strip photoresist;
13. Deposit parylene;
14. Spin and develop photoresist, pattern parylene using oxygen bearing plasma;
15. Strip photoresist and lift off chip with parylene films; and
16. Perform other steps, as desired.

As shown, the method uses a combination of steps including a way of forming an integrated chip and flexible film structure using a parylene bearing material or the like. Other alternatives can also be provided where steps are added, one or more steps are removed, or one or more steps are provided in a different sequence without departing from the scope of the claims herein. Further details of alternative methods and structures can be found throughout the present specification and more particularly below.

Although the above has been described in terms of specific embodiments, there can be other variations, modifications, and alternatives. Although the above has been described in terms of a flexible substrate structure, other types of substrate structures can also be provided depending upon the specific embodiment. As an example, the flexible substrate may not be released and therefore does not exhibit the flexible characteristic. These and other variations will be further described throughout the present specification and more particularly below.

EXAMPLES

To prove the principles and operation of the present invention, we have provided examples of the invention in an effort to manufacture bio-compatible integrated circuit chip structures in a flexible substrate design. Such examples are merely illustrative and should not unduly limit the scope of the claims herein. One of ordinary skill in the art would recognize many variations, modifications, and alternatives. Further details of the present experiments are described below according to the figures.

FIGS. 7-15 are simplified diagrams of experimental results according to embodiments of the present invention. These diagrams are merely examples, which should not unduly limit the scope of the claims herein. One of ordinary skill in the art would recognize many variations, modifications, and alternatives. More particularly, we have focused our experiments on an intraocular retinal prosthesis. As background information, retinal prosthesis includes a wide array of technologies, including a video-capture and data-encoding mechanism, a radio-frequency (RF) coil system for power and data transmission and recovery, an analog/digital driving integrated circuit (IC), and a flexible retinal electrode array for neural stimulation.

Development of a novel technology for packaging of the entire system, especially of the intraocular components, has been desirable for the retinal prosthesis effort. A need for such a technology for the system stems from several underlying elements of the prosthetic device. First, as with any chronic implant, biocompatibility of the implanted materials, especially of those in direct contact with the patient's tissues and fluids, should be ensured. Long-term efficacy of the device must also be guaranteed, because revision surgeries are not tolerable; moisture can not penetrate the package over a period of decades. To ease implantation, the entire packaged system must be flexible such that it can be threaded through a small surgical incision. Of particular importance for the retinal prosthesis is the high-lead-count necessary to achieve truly useful vision. The overall goal for the test bed is to complete a 1,000 electrode system, far more than the 16 electrode device currently in use. Because of the complexity of the driver circuitry necessary for such high-lead-count devices, these circuits typically are off fabricated at a foundry. As yet, there is no cost-effective method for high-density interconnection of foundry-fabricated driver circuitry with the RF coil and retinal stimulator.

Conventional packaging paradigms published in the literature can accommodate center to center pad distances on the driving microchip on the scale of 100 microns. For a 32 by 32 array, this would limit the minimum size of the chip (assuming a square arrangement of pads) to approximately 3.2 mm square. While this is tolerable, it is clear that such an arrangement of driving pads, while enviable, is difficult (output pads are typically grouped spatially), and the size of the incision necessary to accommodate the chip increases as chip real-estate increases. Furthermore, these kinds of interconnection and packaging schemes are usually performed by a skilled technician tediously creating interconnects one by one (as per wire-bonding); for a 1000 electrode device, this is impractical. The need exists for a more simplified interconnection and packaging scheme which, while increasing resolution of interconnection with the driving circuitry beyond current limits, is fully mass-producible and forged almost entirely of biocompatible, flexible materials. A packaging technology which enables fabrication of the entire system on a single wafer is also a goal long-sought for a retinal prosthesis.

Figure 9:
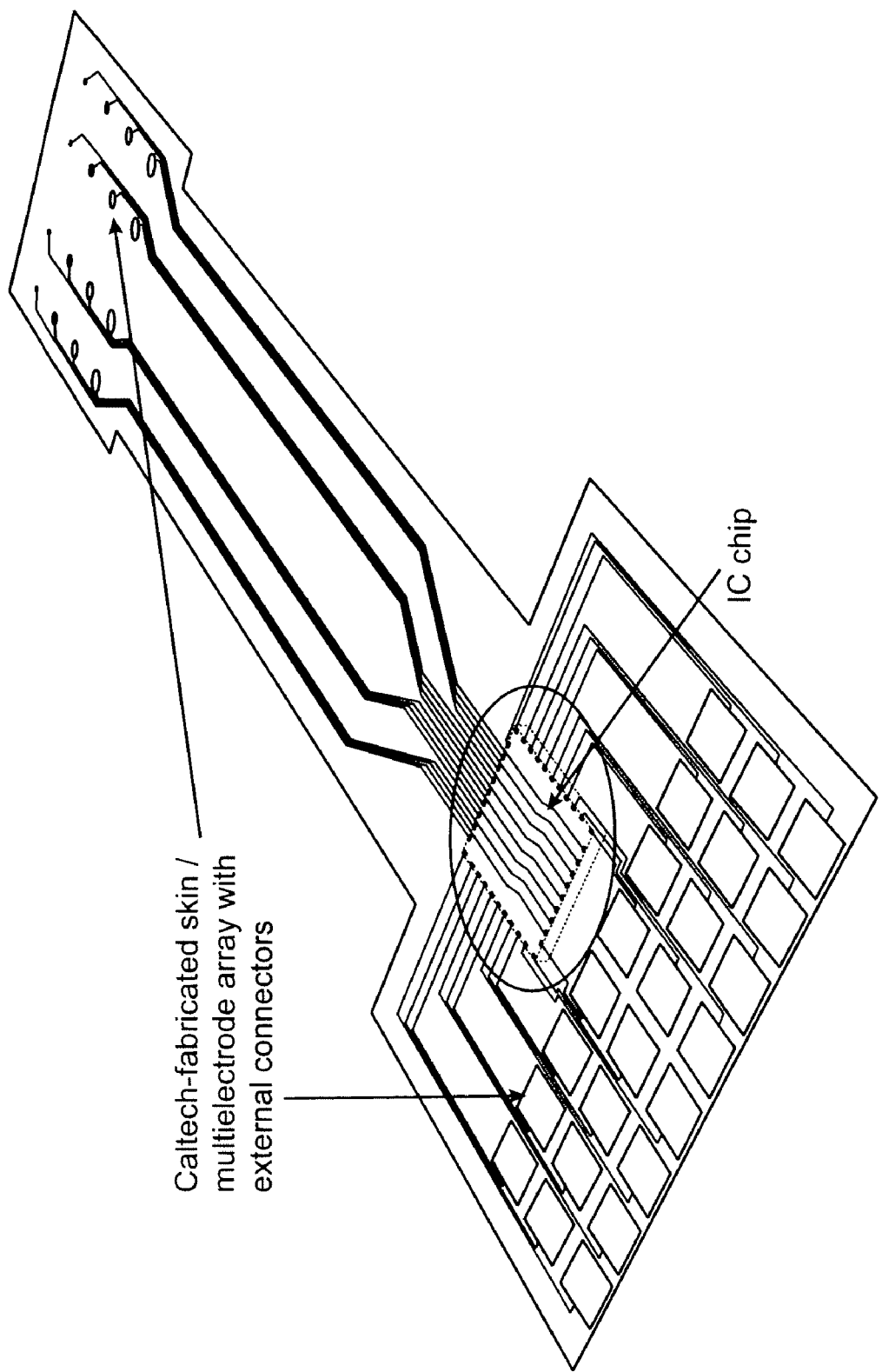

We have developed a new technology for integrating individual prefabricated chips into a flexible parylene substrate with high-density electrical interconnects. Parylene is a USP Class VI biocompatible polymer that is deposited through a highly conformal vapor-deposition process. Of the three most common parylenes (See FIG. 7), parylene C is the most widely used in industry. The advantages of the use of parylene include its proven biocompatibility, its strength and flexibility (Young's Modulus ~4 GPa), its pinhole-free, conformal deposition, and its ease of manipulation using standard microfabrication techniques. Several research groups use parylene as a method for sealing fabricated electrode arrays. Our effort focuses on using parylene as the main substrate for the entire system, minimizing the number of potentially flawed interfaces with other materials. This paradigm also enables simultaneous fabrication of various system components, dramatically simplifying the packaging of the implant. A 16 by 16 platinum electrode array (FIG. 8) has already been fabricated on a parylene substrate, and pulse testing and saline soak testing have demonstrated its potential as an optimal retinal stimulator. An RF coil using parylene as substrate is under development, with fabrication alongside the electrode array being possible. In order for these components to be functional, however, they must be integrated easily with the driving circuitry. Our method for packaging and interconnection involves placing the foundry-fabricated IC chip directly into the fabrication process of the retinal stimulator and RF coil as though the circuitry had originally been manufactured in the host wafer on which these other components are fabricated. FIG. 9 gives a graphical depiction of this idea, where the application specific IC chip (ASIC), fabricated at a foundry, is shown directly integrated with the retinal stimulator, shown at the top-right of the figure (the pads to the bottom-left are used for testing, but in the final system would be replaced with the RF coil).

Chips simulating foundry-fabricated chips were first used to demonstrate the technology. The only properties of these prefabricated chips known a priori were the electrical pad dimensions and locations as well as the overall length, width, and height dimensions of the chip. The simulated chip, consisting of simple electrical shorts and intrinsic resistors, was embedded in a standard silicon wafer using backside mechanical anchoring with parylene. The entire wafer then underwent standard processing as though the circuitry had been prefabricated on the wafer itself, with electrical connections to regions far from the chip being demonstrated.

Figure 10:
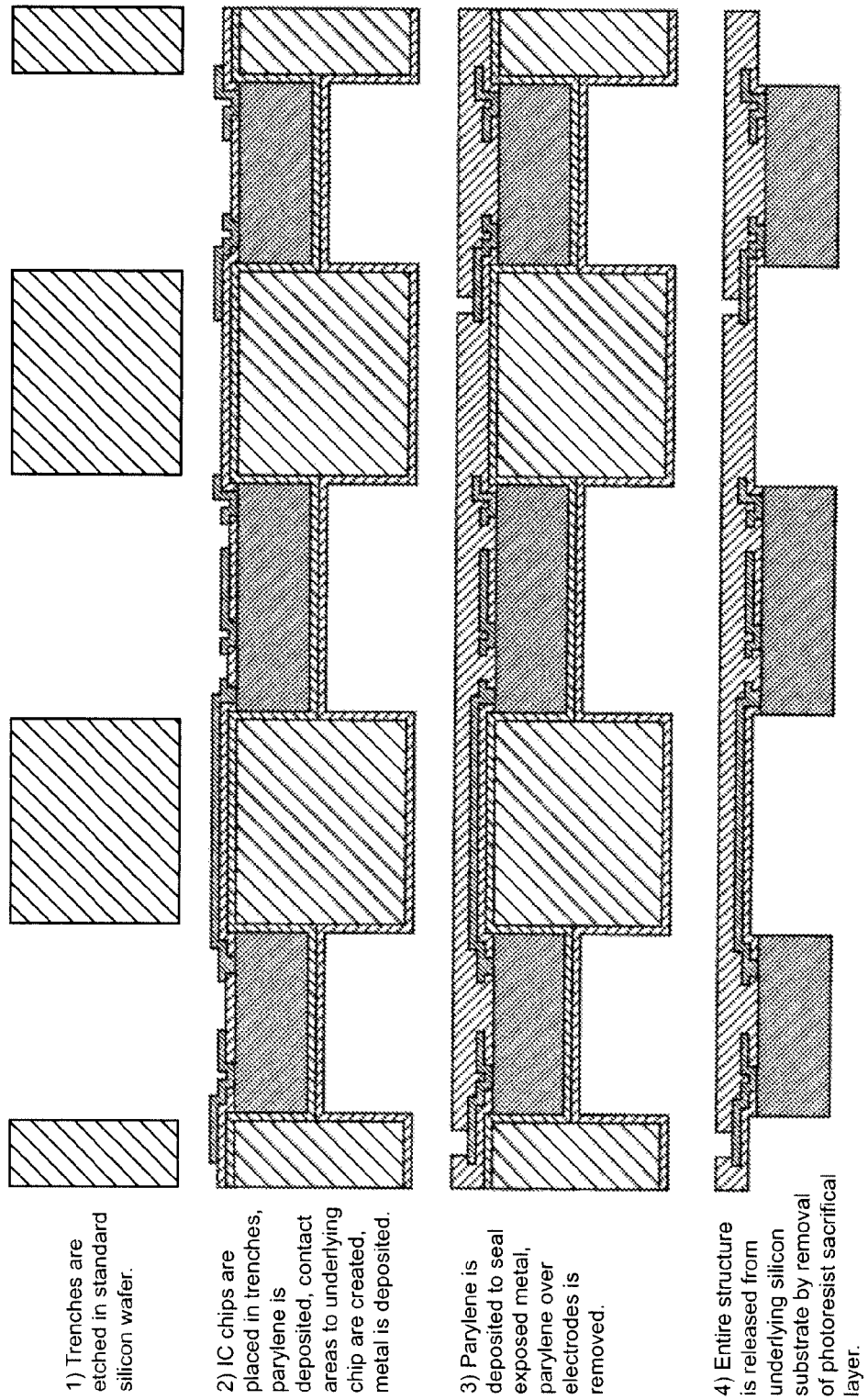

FIG. 10 shows the chip integration and interconnection concept in terms of an abridged process flow. Briefly, trenches are etched in a standard silicon wafer using the Bosch process (ensuring accurate chip alignment to within built-in tolerances). The chips are then self-aligned in these trenches (to within 10 μm lateral displacement) and sealed from the backside with photoresist and parylene. Fabrication is then performed on this wafer as though it were a whole wafer with integrated circuitry. Metallization is performed using an e-beam evaporation process with optimized step coverage. The photoresist sacrificial layer is then removed, leaving a flexible skin with embedded circuitry. Because the IC chip shown in the diagram can be conformally coated with parylene before the entire fabrication process is started, the end result can be a stimulation system which is completely enclosed in parylene, where parylene's pinhole-free coating would make it impermeable to saline. If the need arises, other hermetic coatings can be deposited on the entire structure to increase device longevity.

FIG. 11 shows an overhead view of the parylene "skin" with the simulated IC chip embedded in this manner, and demonstrates the system's size relative to a penny which is seen through the transparent parylene. FIG. 12 shows the backside of the same device. As can be clearly seen from this picture, the entire system is extremely flexible, a feature which facilitates implantation, and, because parylene is the main substrate, the system is also mechanically robust. FIGS. 13 and 14 show a magnified view of the interconnects from the perimeter contacting the circuits on the chip, and the metallization continuity over the perimeter to chip junction, respectively. Table 1 summarizes the electrical data verifying the efficacy of this interconnection scheme. Resistances between the perimeter pads connected to the quadrant of the chip shown in FIG. 15 were measured on a digital multimeter. Any two elements connected above and to the left with an arrow were shorted together on the chip, whereas neighboring elements were connected through the intrinsic resistance of the chip. As can be clearly seen, resistances are what are expected (i.e. $1b$-$7a$, $1a$-$6a$, $2a$-$5a$, $3a$-$4a$ are shorted, all other combinations correspond to intrinsic through-die resistances).

The implications of this kind of technology for the retinal prosthesis packaging effort are far-reaching. As opposed to current paradigms concerning high-lead-count packaging, this technology removes the need for a technician to create electrical and mechanical connections one-by-one. Instead, the limit of the technology is imposed only by lithography, providing capability for a reduction of several orders of magnitude in the center-to-center pad distances that can be accommodated in the process, depending on the type of lithography equipment employed. It also makes the desire for high-density electrode arrays easier to stomach, because the fabrication process places no limit on the number of output pads that can reasonably be connected to the array. In addition to being physically flexible, this package also adds flexibility because individual chips can now be strung together into larger conglomerate circuits post-fabrication and can be directly integrated with the stimulating electrode array. For instance, one team can work on the design of a multiplexer chip, and another can work on a 256 electrode driver chip. In addition to the possibility of fabrication of a 256 electrode array for testing, the multiplexer can be strung together with four of these driver chips to create a 1024 electrode driver circuit without the need for a complete overhaul of the design and expensive fabrication of an entirely new chip. This may prove useful, too, because as electrode density increases, so does the size of the driver chip; if a large chip can be broken down into several individual component chips, these components can be integrated into a flexible skin, folded on top of each other for insertion in the eye through a small incision, and unfolded, thus facilitating surgery. Compounded with the proven biocompatibility of parylene, as well as our ability to modify the parylene surface to be biologically active, this technology, when compared to prior embodiments of the system, opens the door to truly biomimetic prostheses which are capable of providing data, and behaving biologically, much more akin to how the photoreceptors used to in our blind patients.

Although the above has been described in terms of specific embodiments, there can be other variations, modifications, and alternatives. Although the above has been described in terms of a flexible substrate structure, other types of substrate structures can also be provided depending upon the specific embodiment. As an example, the flexible substrate may not be released and therefore does not exhibit the flexible characteristic. These and other variations will be further described throughout the present specification and more particularly below.

What is claimed is:

1. A retinal prosthesis comprising:
   a chip comprising a face and a backside;
   an insulating flexible film overlying the face of the chip;
   at least one opening through a portion of the insulating flexible film to a contact region on the face of the chip;
   a metallization layer overlying the insulating flexible film to couple to the contact region through the at least one opening in the insulating flexible film;
   a flexible protective layer overlying the metallization layer;
   a flexible sandwich structure formed by a first portion of the insulating flexible film, a second portion of the metallization layer, and a third portion of the flexible protective layer, wherein said second portion overlies said first portion and wherein said third portion overlies said second portion; and
   at least one opening through a portion of the flexible protective layer or the insulating flexible film, to couple the metallization layer to at least one electrode suitable to stimulate retinal tissue.

2. The retinal prosthesis according to claim 1, wherein the flexible protective layer comprises poly(p-xylylene), poly(chloro-p-xylylene), or poly(dichloro-p-xylylene).

3. The retinal prosthesis according to claim 1, wherein the insulating flexible film comprises poly(p-xylylene), poly(chloro-p-xylylene), or poly(dichloro-p-xylylene).

4. The retinal prosthesis according to claim 1, wherein the chip was provided in a holder substrate comprising a silicon bearing material.

5. The retinal prosthesis according to claim 1, wherein the chip was provided in a holder substrate selected from an insulating material, a conductive material, or a semi-conductive material.

6. The retinal prosthesis according to claim 5, wherein the insulating material comprise material selected from glass, quartz, plastic, polymer, or any combination of these insulating materials.

7. The retinal prosthesis according to claim 5, wherein the conductive material comprises metal.

8. The retinal prosthesis according to claim 5, wherein the semi-conductive material comprises silicon.

9. The retinal prosthesis according to claim 1, wherein the flexible sandwich structure packages the chip.

10. The retinal prosthesis according to claim 1, wherein a portion of the insulating flexible film is attached to the chip.

11. The retinal prosthesis according to claim 1, wherein the metallization layer is comprised of material selected from the group of aluminum, gold, copper, silver, platinum, titanium, and iridium.

12. The retinal prosthesis according to claim 1, wherein the chip comprises an integrated circuit chip.

13. The retinal prosthesis according to claim 1, wherein said chip is encapsulated by a skin comprising one or both of said insulating flexible film and said flexible protective layer.

14. A retinal prosthesis comprising:
    a video-capture device providing video data;
    a data-encoding mechanism encoding said video data;
    a radio-frequency (RF) coil system transmitting and receiving power and encoded video data;
    an analog/digital driving integrated circuit receiving said power and video data from said radio-frequency coil system, having a face and a backside;
    an insulating flexible film overlying the face of the analog/digital driving integrated circuit;
    at least one opening through a portion of the insulating flexible film to a contact region on the face of the analog/digital driving integrated circuit;
    a metallization layer overlying the insulating flexible film to couple to the contact region through the at least one opening in the insulating flexible film;
    a flexible protective layer overlying the metallization layer;
    a flexible sandwich structure formed by a first portion of the insulating flexible film, a second portion of the metallization layer, and a third portion of the flexible protective layer, wherein said second portion overlies said first portion and wherein said third portion overlies said second portion; and
    at least one opening through a portion of the flexible protective layer or the insulating flexible film, to couple the metallization layer to at least one electrode suitable to stimulate retinal tissue.

15. The retinal prosthesis according to claim 14, wherein the flexible protective layer comprises poly(p-xylylene), poly(chloro-p-xylylene), or poly(dichloro-p-xylylene).

16. The retinal prosthesis according to claim 14, wherein the insulating flexible film comprises poly(p-xylylene), poly(chloro-p-xylylene), or poly(dichloro-p-xylylene).

17. The retinal prosthesis according to claim 14, wherein the analog/digital driving integrated circuit was provided in a holder substrate comprising a silicon bearing material.

18. The retinal prosthesis according to claim 14, wherein the analog/digital driving integrated circuit was provided in a holder substrate selected from an insulating material, a conductive material, or a semi-conductive material.

19. The retinal prosthesis according to claim 18, wherein the insulating material comprise material selected from glass, quartz, plastic, polymer, or any combination of these insulating materials.

20. The retinal prosthesis according to claim 18, wherein the conductive material comprises metal.

21. The retinal prosthesis according to claim 18, wherein the semi-conductive material comprises silicon.

22. The retinal prosthesis according to claim 14, wherein the flexible sandwich structure packages the analog/digital driving integrated circuit.

23. The retinal prosthesis according to claim 14, wherein a portion of the insulating flexible film is attached to the analog/digital driving integrated circuit.

24. The retinal prosthesis according to claim 14, wherein the metallization layer is comprised of material selected from the group of aluminum, gold, copper, silver, platinum, titanium, and iridium.

25. The retinal prosthesis according to claim 14, wherein said analog/digital driving integrated circuit is encapsulated by a skin comprising one or both of said insulating flexible film and said flexible protective layer.

* * * * *

UNITED STATES PATENT AND TRADEMARK OFFICE
CERTIFICATE OF CORRECTION

PATENT NO. : 7,706,887 B2 Page 1 of 1
APPLICATION NO. : 11/933222
DATED : April 27, 2010
INVENTOR(S) : Yu-Chong Tai and Damien C. Rodger It is certified that error appears in the above-identified patent and that said Letters Patent is hereby corrected as shown below:

Statement Regarding Government Sponsored Research, column 1, after line 9 add:

--This invention was made with Government support under Grant Nos. EEC-0310723 and EEC-9402726 awarded by the National Science Foundation. The Government has certain rights in this invention.--

Signed and Sealed this

Twenty-ninth Day of June, 2010

David J. Kappos
*Director of the United States Patent and Trademark Office*